(12) United States Patent
Luoh et al.

(10) Patent No.: US 7,382,054 B2
(45) Date of Patent: Jun. 3, 2008

(54) METHOD FOR FORMING SELF-ALIGNED CONTACTS AND LOCAL INTERCONNECTS SIMULTANEOUSLY

(75) Inventors: Tuung Luoh, Hsinchu (TW);
Ling-Wuu Yang, Hsinchu (TW);
Kuang-Chao Chen, Hsinchu (TW)

(73) Assignee: Macronix International Co., Ltd., Hsin chu (TW)

( * ) Notice: Subject to any disclaimer, the term of this patent is extended or adjusted under 35 U.S.C. 154(b) by 155 days.

(21) Appl. No.: 11/399,770

(22) Filed: Apr. 7, 2006

(65) Prior Publication Data

US 2007/0235798 A1    Oct. 11, 2007

(51) Int. Cl.
*H01L 23/52* (2006.01)

(52) U.S. Cl. .................. 257/774; 257/773; 257/758; 257/315; 257/E23.145; 438/233; 438/229; 438/631

(58) Field of Classification Search .................. 257/774, 257/E23.145; 438/233
See application file for complete search history.

(56) References Cited

U.S. PATENT DOCUMENTS 6,197,670 B1    3/2001 Park
6,482,699 B1    11/2002 Hu et al.
6,881,659 B2 *  4/2005 Park et al. .................. 438/618

\* cited by examiner

*Primary Examiner*—Tu-Tu Ho
(74) *Attorney, Agent, or Firm*—Stout, Uxa, Buyan & Mullins, LLP

(57) ABSTRACT

The present invention relates generally to semiconductors, and more specifically to semiconductor memory device structures and an improved fabrication process for making the same. The improved fabrication process allows the self-aligned contacts and local interconnects to the processed simultaneously. The process allows the minimal distance requirement between the self-aligned contacts and the local interconnects to be widened, which makes the patterning of self-aligned contacts and local interconnects easier. The widened minimal distance requirement also allows further memory cell shrinkage. The improved structures of self-aligned contacts and local interconnects also have excellent isolation characteristic.

13 Claims, 11 Drawing Sheets

METHOD FOR FORMING SELF-ALIGNED CONTACTS AND LOCAL INTERCONNECTS SIMULTANEOUSLY

BACKGROUND OF THE INVENTION

1. Field of the Invention

The present invention relates generally to semiconductors, and more specifically to semiconductor memory device structures and an improved fabrication process for making the same.

2. Description of the Related Art

Flash electrically erasable programmable read only memory (EEPROM) is a class of nonvolatile memory devices that are programmed by hot electron injection and erased by Fowler-Nordheim tunneling. Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The multi-layer stacked gate structure typically includes: a thin gate dielectric or tunnel oxide layer formed on the surface of substrate overlying the channel region; a polysilicon floating gate overlying the tunnel oxide; an interpoly dielectric layer overlying the floating gate; and a polysilicon control gate overlying the interpoly dielectric layer. Additional layers, such as a silicide layer (deposited on the control gate), a poly cap layer (deposited on the gate silicide layer), and a silicon oxynitride layer (deposited on the poly cap layer) may be formed over the control gate. A plurality of Flash EEPROM cells may be formed on a single substrate.

The process of forming Flash memory cells is well known and widely practiced throughout the semiconductor industry. After the formation of the memory cells, electrical connections, commonly known as "contacts" and "local interconnect", must be made to connect the stack gated structures, the source regions and the drain regions to other parts of the chip.

FIG. 1 (Prior Art) shows an exemplary and simplified cross sectional view of a portion of Flash memory cells. The gate structures 210 are formed by a floating gate 214 overlying the gate dielectric layer 212; an interpoly dielectric layer 216 overlying floating gate 214; a control gate 218 overlying interpoly dielectric layer 216; a gate silicide layer 224 deposited on the control gate 218; and a cap layer 228 (of a material such as silicon oxynitride) as a passivating layer deposited on the gate silicide layer 224.

In a conventional process, the source region 202, and the drain region 204 are then formed. The source regions 202 are typically formed by initially affecting a conventional double diffusion implant (DDI). The DDI implants a first dopant (e.g. n-type, such as phosphorous) to form a deeply diffused, but lightly doped N well $202_L$ establishing a graded source-channel junction. The DDI implant is typically driven deeper into the semiconductor substrate 102 by subjecting it to a thermal cycle at high temperature (e.g. 1050° C.). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms the drain region 204.

The sidewall spacers 230 are typically formed of a nitride material using conventional deposition and etching techniques. Alternatively, the sidewall spacers 230 may be formed of an oxide material using chemical vapor deposition (CVD) followed by etching. An etch stop layer 231 is deposited over the semiconductor substrate 102, including over the multi-layer stacked gate structures 210 using conventional techniques, such as CVD. A pre-metal dielectric layer 132 is then deposited over the etch stop layer 231. The pre-metal dielectric layer 132 may include various materials, such as boro-phospho-tetra-ethyl-ortho silicate (BPTEOS) or borophosphosilicate glass (BPSG), formed using plasma enhanced chemical vapor deposition (PECVD).

Self-aligned contacts (SAC) and local interconnects (LI) are made afterwards to connect the stack gated structures, the source regions and the drain regions to other parts of the chip. Self-aligned contacts features are etched with anisotropic pre-metal dielectric (PMD) etch chemistry that does not etch the nitride spacer and etch stop layer. Conventionally, the self-aligned contacts (SAC) and local interconnects (LI) are patterned and filled separately. After pre-metal dielectric layer deposition, a dielectric planarization process, such as CMP, is used to remove dielectric surface topology. Local interconnects (LI) openings 141 are then patterned and etched through the dielectric layer 132, and through the etch stop layer 231 to expose portions of the source regions 202. The openings of LI 141 are formed conventionally with a two-step etch process. A conductive material (or metal) is deposited in the LI openings to form local interconnects. The conductive material, such as tungsten, may be formed using conventional metal deposition techniques, such as CVD and/or physical vapor deposition (PVD). Other conductive materials can be used such as copper. A barrier material (not shown), such as titanium (Ti)/titanium nitride (TiN), is typically deposited to coat the walls of the LI opening prior to the deposition of copper to ensure good adhesion and electrical contact to the walls of the local interconnects 140.

A metal CMP process is used afterwards to remove the excess metal, that is on top of the pre-metal dielectric layer and above the local interconnect feature. After the metal removal, another dielectric layer 133 is deposited. The dielectric layer 133 can include various materials, such as silicon dioxide, BPSG, or low-k dielectric, formed using plasma enhanced chemical vapor deposition (PECVD).

After dielectric layer 133 deposition, openings of contacts 140 are etched through the dielectric layer 133 and dielectric layer 132, and through the etch stop layer 131 to expose portions of the drain regions 204. The openings of contacts 140 are formed conventionally with a multi-step etch process. A conductive material, such as tungsten, may be formed using conventional metal deposition techniques, such as CVD and/or physical vapor deposition (PVD). Other conductive materials can be used such as copper. A barrier material (not shown), such as titanium (Ti)/titanium nitride (TiN), is typically deposited to coat the walls of the LI opening prior to the deposition of copper to ensure good adhesion and electrical contact to the walls of the contacts 140.

To prevent shorting of contacts 140 with local interconnects 141, a minimum distance, $D_{min}$, between contacts 140 and local interconnects 141 is required. This minimum distance requirement limits the miniaturization of memory cells.

FIG. 2 (Prior Art) is a top view of FIG. 1. FIG. 1 is a cross sectional view along line A-A of FIG. 2. A memory cell 10 includes a gate structure 210, a source region 202, and a drain region 204, which is below the self-aligned contact 140. Control gate 218 runs across the memory cells. Self-aligned contacts 140 and local interconnects 141, which runs across the memory cells, are allowed to cover part of the gate structure 210, but a minimum distance, $D_{min}$, is needed to ensure no shorting between the contacts 140 and the local interconnects 141. This requirement of minimum distance, $D_{min}$, makes patterning contacts and local interconnects difficult. Especially, when the contacts 140 are patterned after the local interconnects 141. Accurate masks alignment and wide spacing between the contacts 140 and local interconnects 141 must be used to ensure that contacts 140 do not short local interconnects 141. The required wide spacing significantly increases semiconductor memory core cell size and therefore adversely impacts semiconductor device and memory densities. Moreover, this problem is becoming more critical as separation between adjacent gate structures diminishes with semiconductor technology feature size scaling down to sub-quarter micron level and below.

In view of the foregoing, there is a need for an improved processing method that allows further miniaturization of memory devices without adversely affecting device performance.

SUMMARY OF THE INVENTION

The present invention relates generally to semiconductors, and more specifically to semiconductor memory device structures and an improved fabrication process for making the same.

In one embodiment, a method of manufacturing semiconductor devices on a semiconductor substrate comprises the operation of forming a plurality of multi-layer structures on the semiconductor substrate, wherein there are active source and drain device regions between and below the plurality of multi-layer structures. The method also comprises the operations of forming an etch stop layer over the semiconductor substrate with the plurality of multi-layer structures and forming a first dielectric layer over the etch stop layer, wherein the thickness of the first dielectric layer is greater than the combined thickness of the plurality of the multi-layer structures and the etch stop layer. The method further comprises the operations of planarizing the first dielectric layer to expose a portion of the etch stop layer, and etching through the first dielectric layer and through the etch stop layer to create openings of the first portions of contacts and local interconnects simultaneously. Additionally, the method comprises the operations of depositing a first conductive layer in the first portions of contacts and local interconnects, and planarizing the first conductive layer by chemical mechanical polishing to remove the first conductive layer that is not in the openings of the first portions of contacts and local interconnects. The method further comprises the operations of depositing a second dielectric layer over the first dielectric layer and patterning second portions of contacts above the first portions of contacts and etching through the second dielectric layer to create openings of the second portions of contacts above the first portions of contacts. In addition, the method comprises the operation of filling up a second conductive layer in the second portion of contacts, wherein the second conductive layer is in contact with the first conductive layer in the openings of the first portions of contacts.

In another embodiment, a method of manufacturing memory devices on a semiconductor substrate comprises the operations of forming a plurality of multi-layer gate structures on the semiconductor substrate, wherein there are active source and drain device regions between and below the plurality of multi-layer gate structures, and forming a nitride etch stop layer over the semiconductor substrate with the plurality of multi-layer gate structures. The method also comprises the operations of forming a first dielectric layer over the etch stop layer, wherein the thickness of the first dielectric layer is greater than the combined thickness of the plurality of the multi-layer gate structures and the etch stop layer, and planarizing the first dielectric layer by chemical mechanical polishing to remove topology of the plurality of multi-layer structures on the substrate and the etch stop layer is used as a chemical mechanical polishing stop layer. In addition, the method comprises the operations of patterning first portions of self-aligned contacts and local interconnects and etching through the first dielectric layer and through the etch stop layer to create openings of the first portions of self-aligned contacts and local interconnects, depositing a first conductive layer in the first portions of contacts and local interconnects, and planarizing the first conductive layer by chemical mechanical polishing to remove the first conductive layer that is not in the openings of the first portions of contacts and local interconnects. Besides, the method comprises the operations of depositing a second dielectric layer over the first dielectric layer, and patterning second portions of self-aligned contacts above the first portions of contacts by etching through the second dielectric layer to create openings of the second portions of contacts. The method also comprises the operations of depositing a second conductive layer in the second portion of contacts, wherein the second conductive layer is in contact with second portion of contacts, and planarizing the second conductive layer by chemical mechanical polishing to remove the second conductive layer that is not in the features of the second portion of contacts.

In yet another embodiment, a semiconductor device comprises a plurality of multi-layer gate structures on a semiconductor substrate, wherein there are active regions between and below the plurality of multi-layer gate structures and there are spacers on both sides of the plurality of multi-layer gate structures, and an etch stop layer over the plurality of multi-layer gate structures. The semiconductor device also comprises first portions of contacts filled with a first conductive layer contacting active regions between the plurality of gate structures, and local interconnects filled with the first conductive layer contacting active source regions, wherein both the top surfaces of the first portions of the contact and the local interconnects are leveled with the top surface etch stop layer, and a first dielectric layer filled the space between the plurality of multi-layer gate structures, the first portions of contacts and the local interconnects. In addition, the semiconductor device comprises second portions of contacts filled with a second conductive layer are disposed above the first portion of contacts, wherein a second dielectric layer filled the space between the second portion of contacts.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as will be apparent to one having ordinary skill in the art, the invention may be practiced without these specific details. In other instances, well-known methods, procedures, components, and circuits have not been described in detail so that aspects of the invention will not be obscured.

The disclosed embodiments provide a processing method and structures of local interconnect which allow easier patterning of both contacts 240 and local interconnects 241 and also allow the minimal spacing requirement between contacts and local interconnects to be relaxed. In addition, the contacts and local interconnects made by the disclosed process achieves excellent isolation characteristics. The disclosed embodiments also simplify the process flow. The self-aligned contacts (SAC) and local interconnects (LI) are be processed simultaneously.

Figure 3A:
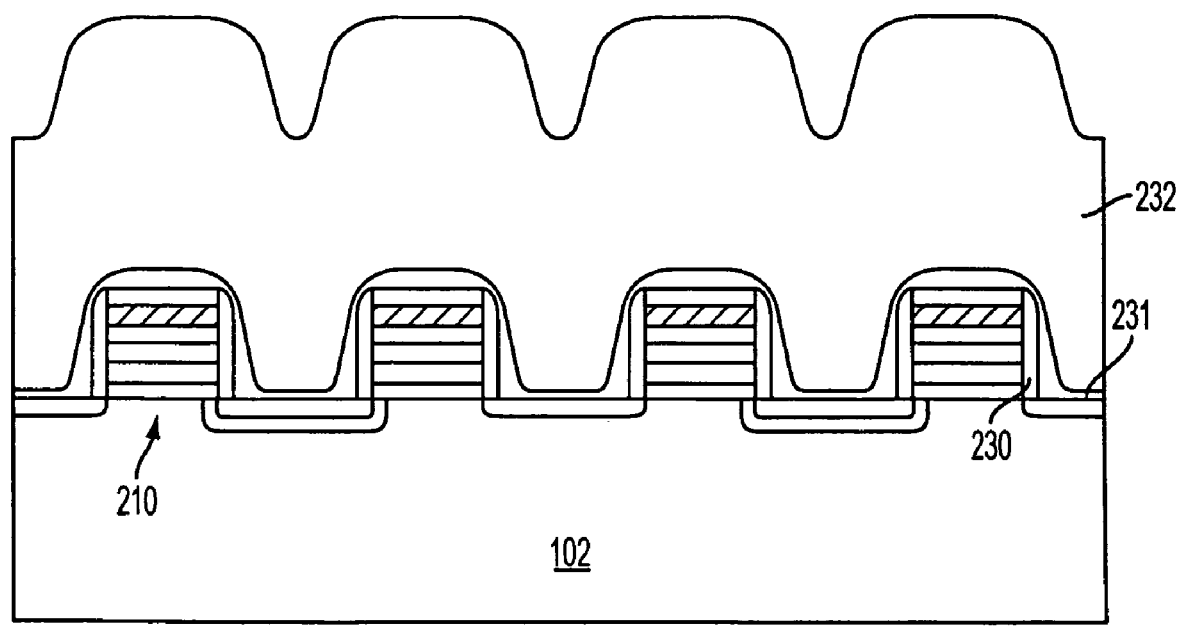
FIG. 3A shows a pre-metal dielectric layer deposited on a multi-layer gate structure.
Figure 3B:
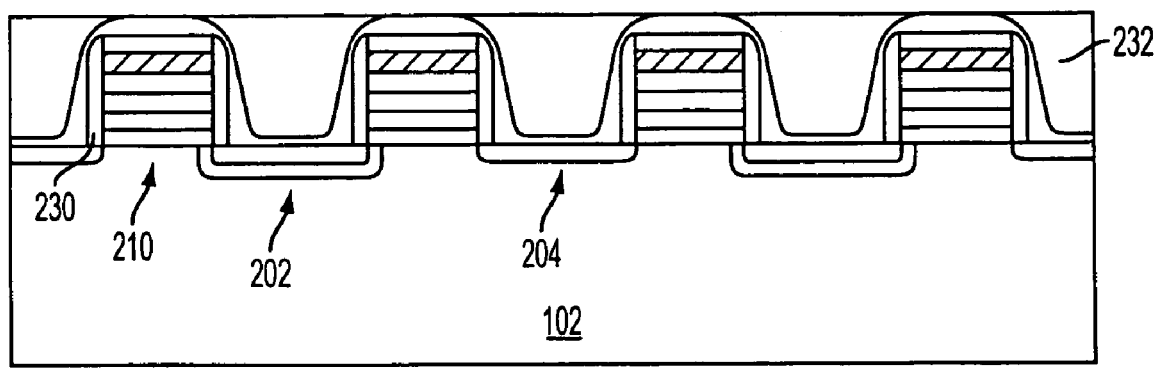
FIG. 3B shows the substrate of FIG. 3A with planarized pre-metal dielectric layer.

FIGS. 3A-3H show an embodiment of the current invention. After the gate structures 210, spacers 230, active regions 202, 204, and etch stop layer 231 are formed on the substrate 201, a pre-metal dielectric layer 232 is deposited as shown in FIG. 3A. The pre-metal dielectric layer 232 may include various materials, such as boro-phospho-tetra-ethyl-ortho silicate (BPTEOS) or borophosphosilicate glass (BPSG), formed using plasma enhanced chemical vapor deposition (PECVD). The etch stop layer 231 is typically formed of a nitride material, such silicon nitride, and is formed to a thickness typically in the range of approximately 30 to 120 nm. The etch stop layer 231 reduces the effective spacing in the horizontal direction between the multi-layer stacked gate structures. As mentioned earlier, an exemplary pre-metal dielectric layer is BPSG, deposited by a PECVD process. The BPSG layer follows the contours of the gate structures. The surface topology of the dielectric layer 232 follows the contours of the gate structures 210, spacers 230, and the etch stop layer 231. The surface topology is removed by a dielectric CMP process. The etch stop layer 231, typically a nitride film, can be used as a polish stop layer due to its high polish selectivity to oxide. The post dielectric CMP surface is shown in FIG. 3B. The thickness of the dielectric layer 232 deposited prior to dielectric CMP in FIG. 3A is less than the prior art dielectric thickness 132, since the dielectric layer 232 only needs to fill up to the level of the etch stop layer 231. In contrast, the prior art deposited thickness of dielectric layer 132 needs to be thicker to ensure that after dielectric CMP process, the thickness is higher than the top surface of the etch stop layer 231.

Figure 3C:
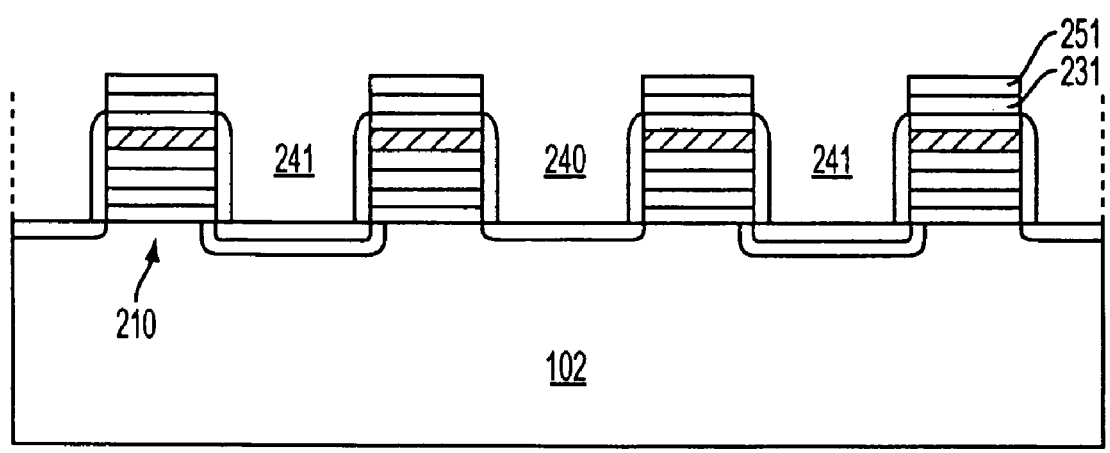
FIG. 3C shows substrate of FIG. 3B after it is patterned and etched with features of first portions of contacts and local interconnects.
Figure 3D:
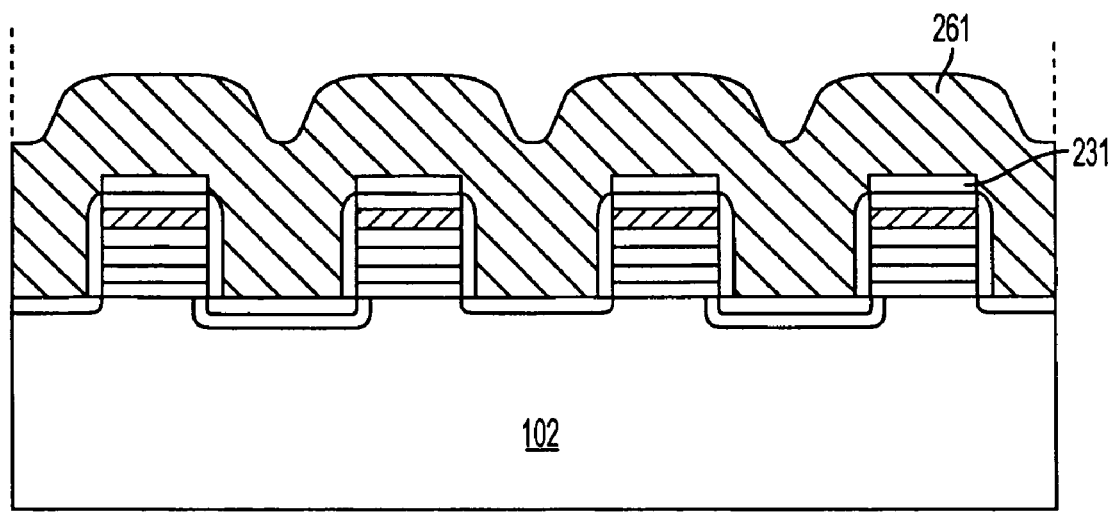
FIG. 3D show the openings of first portions of contacts and local interconnects of FIG. 3C being filled with a conductive layer
Figure 3E:
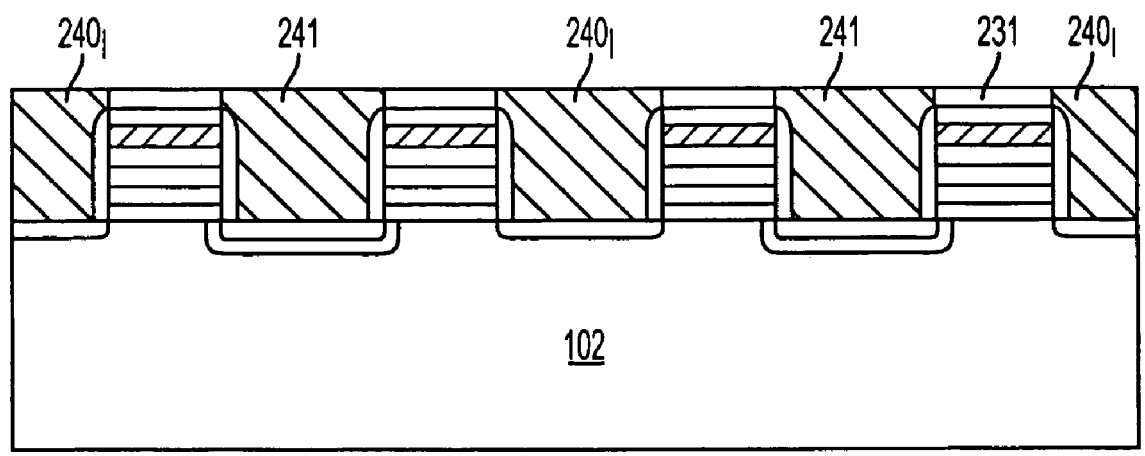
FIG. 3E shows the excess conductive layer outside the openings of the first portions of contacts and local interconnects are removed by CMP.

In FIG. 3C, the openings of local interconnects (LI) 241 and first portions of SAC $240_I$ are patterned and etch simultaneously with mask 251. The minimal distance requirement between the openings of local interconnects 241 and the first portions of SAC $240_I$ is more relaxed, which will be explained below. After removal of the remaining photoresist 251, a conductive material, such as tungsten, may be deposited to fill the first portions of SAC and LI using conventional metal deposition techniques, such as CVD and/or physical vapor deposition (PVD), as shown in FIG. 3D. Other conductive materials can be used such as copper. A barrier material (not shown), such as titanium (Ti)/titanium nitride (TiN), is typically deposited to coat the walls of the openings of LI and SAC prior to the deposition of tungsten to ensure good adhesion and electrical contact to the walls of the LI and SAC. FIG. 3E shows that a metal CMP process has been used to remove all metal, such as tungsten that is not in the openings of first portions of SAC $240_I$ and LI 241. The nitride stop layer 231 can again be used as a polish stop layer. A metal CMP process that has high selectivity to nitride layer 231 can be used to minimize dishing of metal in the first portion of SAC and LI. Since the first portion of SAC and LI are separated by the gate structures and the etch stop layer 231 in the current invention, their patterning is much easier than prior art. The requirement is that there needs to be enough etch stop layer 231 between the first portions of SAC and LI to allow the etch stop layer to be a good metal CMP stop and also to ensure there is no electrical leakage between the LI and the first portions of SAC during operation. The minimal distance should be in the order of about 20 nm.

Figure 1:
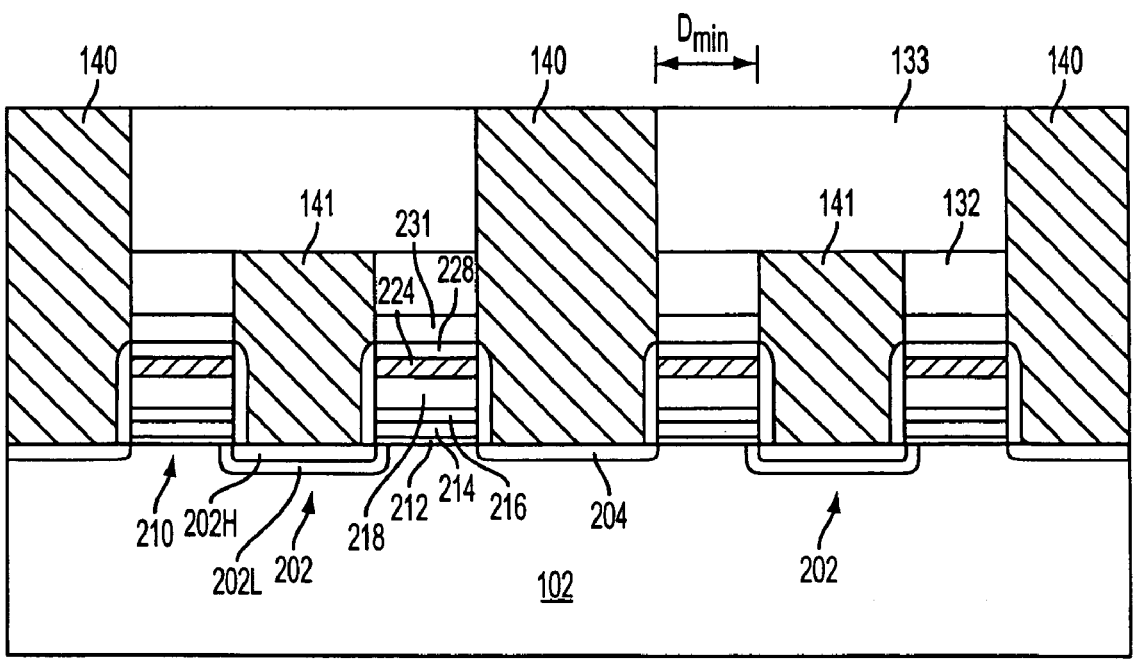
FIG. 1 (Prior Art) illustrates a sectional view of a portion of the core region of a flash memory.
Figure 2:
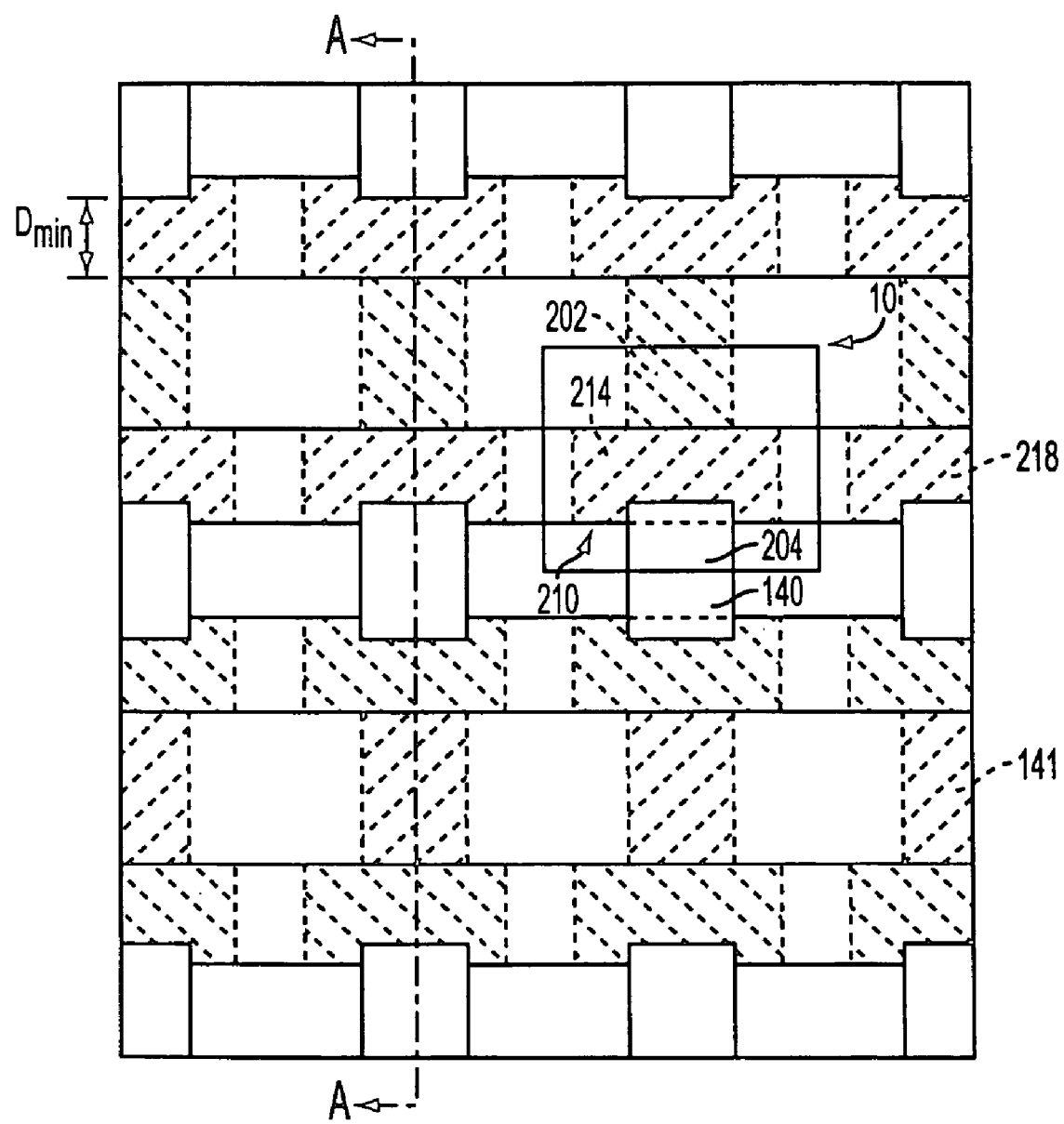
FIG. 2 (Prior Art) illustrates a top view of a portion of the core region of a flash memory that corresponds with FIG. 1.
Figure 3F:
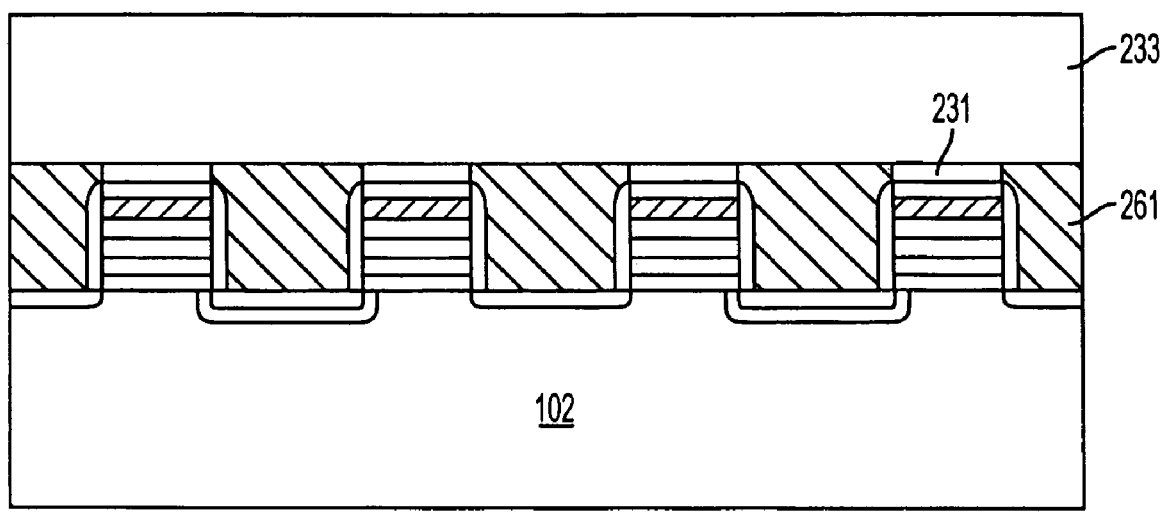
FIG. 3F shows a second dielectric layer is deposited on the substrate of FIG. 3E.
Figure 3G:
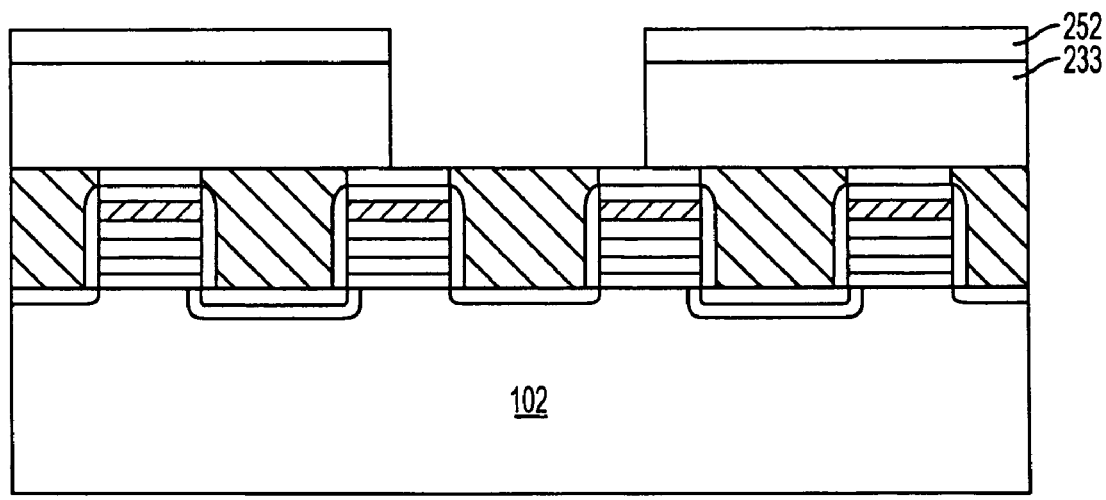
FIG. 3G shows the substrate of FIG. 3F after it is patterned and etched with features of second portions of contacts.
Figure 3H:
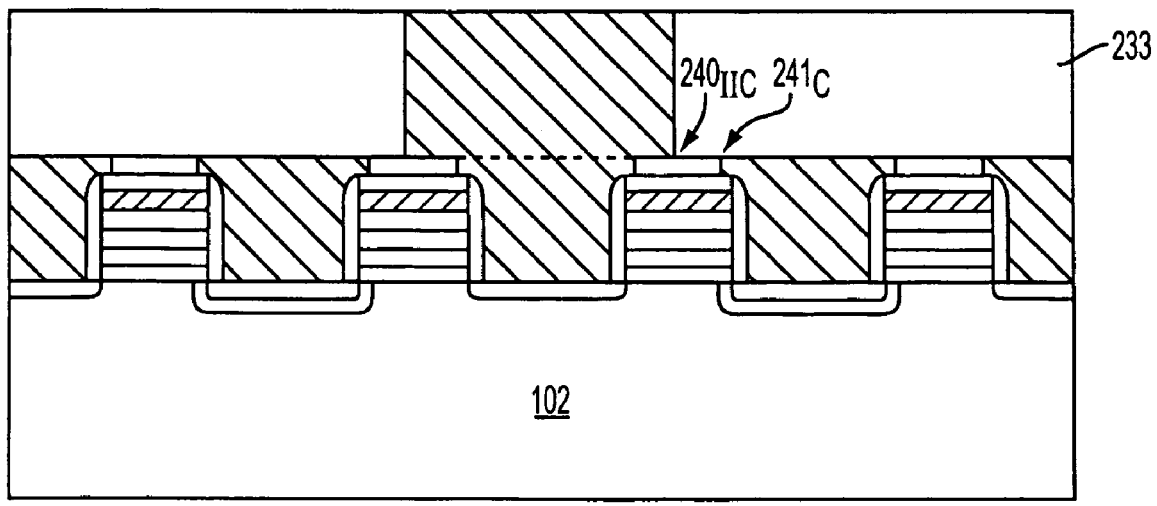
FIG. 3H shows the openings of contacts of FIG. 3G being filled with a conductive layer.

Another dielectric layer 233 is then deposited over the substrate in FIG. 3F. The dielectric layer 233 can include various materials, such as silicon dioxide, BPSG, or low-k dielectric, formed using plasma enhanced chemical vapor deposition (PECVD). Afterwards, pattering and etching of the second portion of the contact of the SAC, $240_{II}$, is performed with mask 252, as shown in FIG. 3G. A conductive layer, such as W, is then filled in the openings of the second portions of the SAC $240_{II}$. Metal CMP is then performed to leave only the metal layer in the openings of the second portions of the SAC $240_{II}$, as shown in FIG. 3H. Since local interconnects 241' is only filled to level with the etch stop layer 231, the likelihood for the local interconnects to short with the SAC is much reduced. Therefore, the patterning of the second portion of SAC, $240_{II}$, is easier in terms of mask alignment of the second portions of SAC $240_{II}$ to the first portions of SAC $240_I$. In addition, the minimal spacing requirement between the SAC and the LI can be relaxed. The edge of the contacts $240_{IIC}$ only need to be away from the corner of the local interconnects, $241_C$, by a distance that would not have electrical leakage during operation. This minimal distance is in the order of about 20 nm to ensure no electrical leakage during operation. The chance for shorting between the contacts 240' and the local interconnects 241' of the present invention is much reduced compared to the conventional structures. In conventional structures, as shown in FIG. 1, the local interconnects 141 extends above the gate structures and are more likely to short with the contacts 140 along the walls of the SAC and LI, if the profiles of the openings of the SAC and LI are not ideal than the contact $240_{II}$ with the buried local interconnects 241, as shown in FIG. 3H. Therefore, the isolation characteristic of the present invention is better than the conventional process method and structure.

Figure 4:
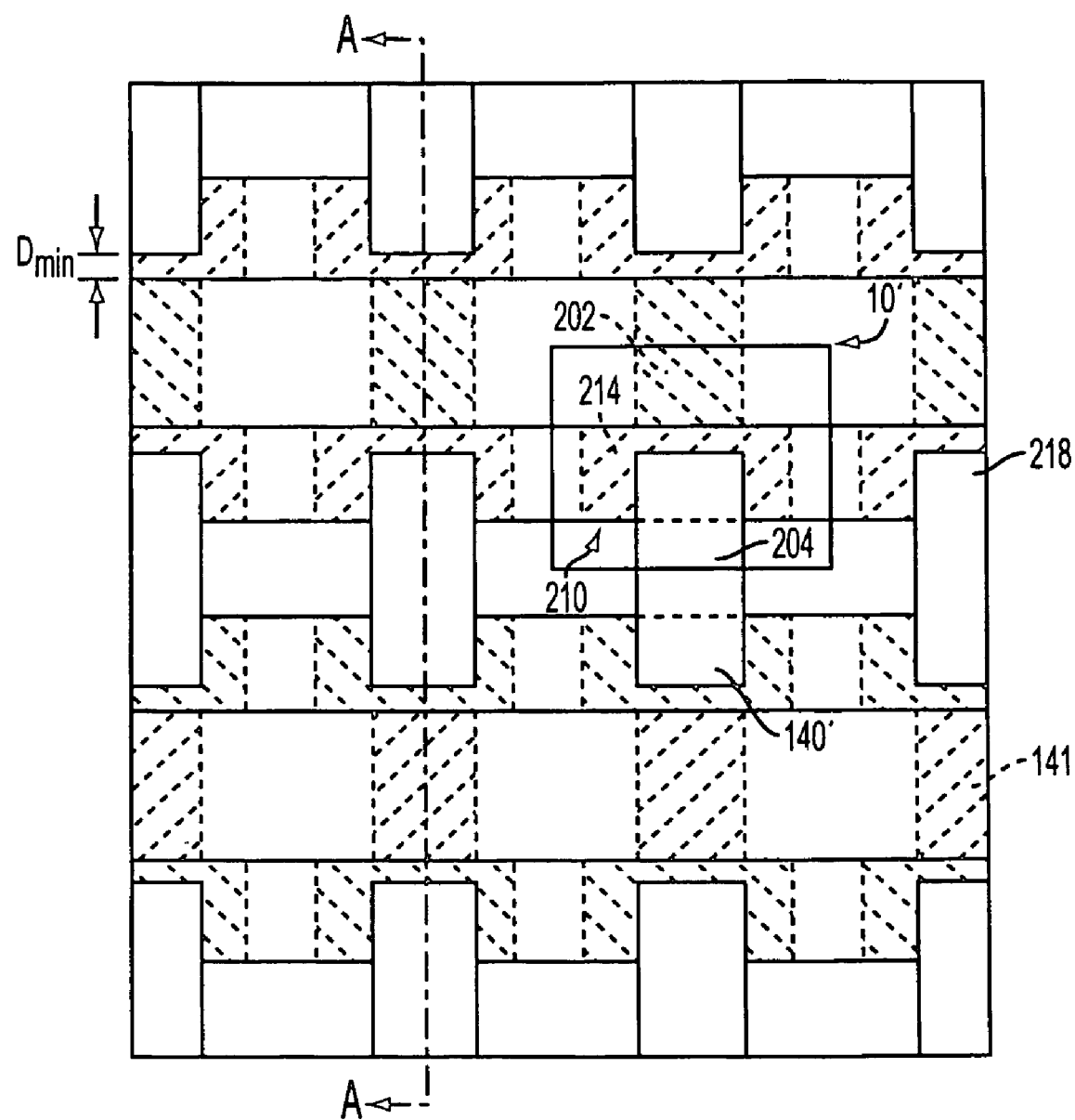
FIG. 4 shows a top view of a portion of the core region of a flash memory that corresponds with FIG. 3H.

FIG. 4 shows the top view of the cell array similar to FIG. 1. With the new process, the SAC pattern can be extended to cover both the drain region and all most all widths of both gates on either side of the drain region. LI pattern can also cover the width of the source region and reach into the gate structures. This relaxed requirement makes patterning design and alignment easier. The minimal distance between the LI and the first portions of SAC is about 20 nm to allow sufficient etch stop layer 231 between the LI and first portions of SAC for the etch stop layer 231 to be a good metal CMP stop layer and also to ensure no electrical leakage between the LI and the first portions of SAC. The minimal distance between the LI and the second portions of the SAC is about 20 nm to ensure no electrical leakage between the LI and second portions of SAC during operation. The new process flow is simpler than conventional process flow, is easier to pattern, has much less stringent minimal distance requirement, and has excellent isolation characteristic. The less stringent minimal distance requirement also makes further shrinking of memory cell possible.

The process shown above with Flash memory is merely used as an example. The concept of the process can also be used for any type of devices, such as DRAM, that uses SAC process, which uses a contact etch stop layer, and can benefit from the concept.

The foregoing descriptions of specific embodiments have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A method of manufacturing semiconductor devices on a semiconductor substrate, comprising the steps of:
   forming a plurality of multi-layer structures on the semiconductor substrate, wherein there are active source and drain device regions between and below the plurality of multi-layer structures;
   forming an etch stop layer over the semiconductor substrate with the plurality of multi-layer structures;
   forming a first dielectric layer over the etch stop layer, wherein the thickness of the first dielectric layer is greater than the combined thickness of the plurality of the multi-layer structures and the etch stop layer;
   planarizing the first dielectric layer to expose a portion of the etch stop layer;
   etching through the first dielectric layer and through the etch stop layer to create openings of the first portions of contacts and local interconnects simultaneously;
   depositing a first conductive layer in the first portions of contacts and local interconnects;
   planarizing the first conductive layer by chemical mechanical polishing to remove the first conductive layer that is not in the openings of the first portions of contacts and local interconnects;
   depositing a second dielectric layer over the first dielectric layer;
   patterning second portions of contacts above the first portions of contacts and etching through the second dielectric layer to create openings of the second portions of contacts above the first portions of contacts; and
   filling up a second conductive layer in the second portion of contacts, wherein the second conductive layer is in contact with the first conductive layer in the openings of the first portions of contacts.

2. The method of manufacturing semiconductor devices of claim 1, wherein the plurality of multi-layer structures are gate structures comprising a floating gate and a control gate.

3. The method of manufacturing semiconductor devices of claim 1, wherein the etch stop layer is a nitride layer.

4. The method of manufacturing semiconductor devices of claim 1, wherein first dielectric layer is a BPSG layer deposited by PECVD.

5. The method of manufacturing semiconductor devices of claim 1, wherein the first conductive layer is a tungsten layer.

6. The method of manufacturing semiconductor devices of claim 1, wherein the second dielectric layer is a silicon dioxide deposited by PECVD.

7. The method of manufacturing semiconductor devices of claim 1, wherein the second conductive layer is a tungsten layer.

8. The method of manufacturing semiconductor devices of claim 1, wherein the etch stop layer is used a chemical mechanical polishing stop during planarizing the second conductive layer.

9. The method of manufacturing semiconductor devices of claim 1, wherein the semiconductor devices are Flash memory.

10. The method of manufacturing semiconductor devices of claim 1, wherein the semiconductor devices are DRAM.

11. A method of manufacturing memory devices on a semiconductor substrate, comprising the operations of:
    forming a plurality of multi-layer gate structures on the semiconductor substrate, wherein there are active source and drain device regions between and below the plurality of multi-layer gate structures;
    forming a nitride etch stop layer over the semiconductor substrate with the plurality of multi-layer gate structures;
    forming a first dielectric layer over the etch stop layer, wherein the thickness of the first dielectric layer is greater than the combined thickness of the plurality of the multi-layer gate structures and the etch stop layer;
    planarizing the first dielectric layer by chemical mechanical polishing to remove topology of the plurality of multi-layer structures on the substrate and the etch stop layer is used as a chemical mechanical polishing stop layer;
    patterning first portions of self-aligned contacts and local interconnects and etching through the first dielectric layer and through the etch stop layer to create openings of the first portions of self-aligned contacts and local interconnects simultaneously;

depositing a first conductive layer in the first portions of contacts and local interconnects;

planarizing the first conductive layer by chemical mechanical polishing to remove the first conductive layer that is not in the openings of the first portions of contacts and local interconnects;

depositing a second dielectric layer over the first dielectric layer;

patterning second portions of self-aligned contacts above the first portions of contacts by etching through the second dielectric layer to create openings of the second portions of contacts;

depositing a second conductive layer in the second portion of contacts, wherein the second conductive layer is in contact with second portion of contacts; and planarizing the second conductive layer by chemical mechanical polishing to remove the second conductive layer that is not in the features of the second portion of contacts.

12. The method of manufacturing memory devices of claim 11, wherein the semiconductor devices are Flash memory.

13. The method of manufacturing memory devices of claim 11, wherein the semiconductor devices are DRAM.

* * * * *